(12) United States Patent
Gueissaz

(10) Patent No.: US 11,081,956 B2
(45) Date of Patent: Aug. 3, 2021

(54) THERMOELECTRIC GENERATOR WITH STARTING CIRCUIT

(71) Applicant: The Swatch Group Research and Development Ltd, Marin (CH)

(72) Inventor: Francois Gueissaz, Cormondreche (CH)

(73) Assignee: The Swatch Group Research and Development Ltd, Marin (CH)

( * ) Notice: Subject to any disclaimer, the term of this patent is extended or adjusted under 35 U.S.C. 154(b) by 548 days.

(21) Appl. No.: 16/035,917

(22) Filed: Jul. 16, 2018

(65) Prior Publication Data

US 2019/0020267 A1    Jan. 17, 2019

(30) Foreign Application Priority Data

Jul. 17, 2017    (EP) .................................... 17181591

(51) Int. Cl.
| | |
|---|---|
| *H02M 1/36* | (2007.01) |
| *H02M 3/156* | (2006.01) |
| *H01L 35/28* | (2006.01) |
| *H02M 3/158* | (2006.01) |
| *H01M 8/18* | (2006.01) |
| *H02M 3/155* | (2006.01) |

(52) U.S. Cl.
CPC .............. *H02M 1/36* (2013.01); *H01L 35/28* (2013.01); *H01M 8/182* (2013.01); *H02M 3/158* (2013.01); *H02M 3/1582* (2013.01); *H02M 3/156* (2013.01); *H02M 2003/1552* (2013.01)

(58) Field of Classification Search
CPC ................................ H02M 1/36; H02M 3/156
USPC .... 323/274, 275, 284, 285, 901; 363/49, 78, 363/79, 124
See application file for complete search history.

(56) References Cited

U.S. PATENT DOCUMENTS

| | | |
|---|---|---|
| 2005/0072987 A1 | 4/2005 | Robb et al. |
| 2005/0179084 A1 | 8/2005 | Robb et al. |

(Continued)

FOREIGN PATENT DOCUMENTS

JP       2000-060115       2/2000

OTHER PUBLICATIONS

European Search Report dated Jan. 25, 2018 in European Application 17181591.3 filed on Jul. 17, 2017.

*Primary Examiner* — Gary A Nash
(74) *Attorney, Agent, or Firm* — Oblon, McClelland, Maier & Neustadt, L.L.P.

(57) ABSTRACT

A thermoelectric generator includes a voltage source including a thermoelectric element, a starting circuit connected to the voltage source, a DC to DC converter circuit connected to the voltage source, an output connected to the starting circuit and connected to the DC to DC converter circuit, and a controller having an input connected to the voltage source, and outputs connected to the starting circuit and to the DC to DC converter circuit. The controller deactivates the starting circuit and activates the DC to DC converter circuit when a voltage at the output or when a voltage provided by the voltage source rises above a predefined upper voltage threshold. Additionally, the controller reactivates the starting circuit and deactivates the DC to DC converter circuit when a voltage at the output or when a voltage provided by the voltage source drops below a predefined lower voltage threshold.

13 Claims, 2 Drawing Sheets

(56) References Cited

U.S. PATENT DOCUMENTS

| | | | | |
|---|---|---|---|---|
| 2010/0208498 A1* | 8/2010 | Rubio | ............... | H02M 3/155 |
| | | | | 363/18 |
| 2013/0182464 A1* | 7/2013 | Woias | ............... | H02M 3/33507 |
| | | | | 363/21.17 |
| 2014/0204615 A1* | 7/2014 | Woias | ............... | H02M 7/5388 |
| | | | | 363/17 |
| 2014/0233270 A1* | 8/2014 | Desai | ............... | H02M 3/33507 |
| | | | | 363/21.12 |
| 2016/0119987 A1* | 4/2016 | Chen | ............... | H05B 45/50 |
| | | | | 315/224 |
| 2016/0293824 A1* | 10/2016 | Ueno | ............... | H02M 3/156 |

* cited by examiner

THERMOELECTRIC GENERATOR WITH STARTING CIRCUIT

This application claims priority from European Patent Application No. 17181591.3 filed on Jul. 17, 2017; the entire disclosure of which is incorporated herein by reference.

DESCRIPTION

The present invention relates to a thermoelectric generator as well as to a mobile electronic device comprising such a thermoelectric generator. Moreover the invention relates to a voltage converter providing conversion of an ultra-low input voltage into a usable output voltage over a large range of output power.

BACKGROUND

A thermoelectric generator (TEG), also called Seebeck generator, is a device that converts heat flux directly into electrical energy through a phenomenon called the Seebeck effect. A thermoelectric generator typically includes a thermoelectric element comprising of a number of pairs of a P type element and an N type element. These elements are placed in parallel between two plates, and electrically connected in series, alternating P and N type elements. The temperature difference between the plates creates a thermal flow inducing a flow of holes in the P type elements and a flow of electrons in the N type elements, and therefore a potential difference between the plates.

However, a thermoelectric element provides generally a rather low electrical output voltage, particularly if a temperature difference to which the plates are exposed to, is rather small, typically in the range of 1 to 10° C. The potential difference between the plates is the sum of all the electrical potential differences across the P and N type elements, typically 50 to 200 microVolts per ° C. temperature difference between the plates and per element. To increase this voltage, a thermoelectric generator generally comprises a DC to DC voltage converter, placed at the output of the thermoelectric element. Nevertheless, DC to DC voltage converters available on the market are unable to work with a high efficiency with ultra-low voltage inputs, typically a few milliVolts.

It is therefore an aim of the present invention to provide a thermoelectric generator comprising a thermoelectric element and a step-up DC to DC conversion system, in which the DC to DC conversion system is able to efficiently convert ultra-low power voltages, as low as 1 milliVolt, available at the output of the thermoelectric element, into voltage of typically 1 to 5 Volts.

SUMMARY OF THE INVENTION

In one aspect there is provided a thermoelectric generator comprising a voltage source comprising a thermoelectric element, a starting circuit connected to the voltage source, a step-up DC to DC converter circuit that is connected to the voltage source and an output connected to the starting circuit and connected to the DC to DC converter circuit. Moreover, the thermoelectric generator comprises a controller comprising outputs connected to the starting circuit and to the DC to DC converter circuit, and an input connected to the voltage source. The controller is configured to deactivate the starting circuit and to activate the DC to DC converter circuit when a voltage or a current at the output, or when a voltage provided by the voltage source, or any signal representing the available output power from the voltage source, increases above a first predefined threshold level, called upper threshold level.

The controller is further configured to re-activate the starting circuit and to deactivate the DC to DC converter circuit when the voltage at the output or when a voltage provided by the voltage source, or any signal representing the available output power from the voltage source, drops below a second predefined threshold level, called lower threshold level.

The controller is particularly configured to concurrently activate and to deactivate only one of the starting circuit and the DC to DC converter circuit, whenever the starting circuit has been operating or an electrical storage device has been sufficiently charged to sustain the controller's function. In particular, the controller is configured to operate only one of the starting circuit and the DC to DC converter circuit at a time. If the starting circuit is operating below the upper threshold level, the DC to DC converter circuit is kept deactivated by the controller. If the DC to DC converter circuit is operating above the upper threshold level, the starting circuit is kept deactivated by the controller. In this way the thermoelectric generator is configured to operate in two different operation modes.

The starting circuit is re-activated and the DC to DC converter stops operating as soon as a voltage provided by the voltage source or as soon as a voltage provided at the output of the thermoelectric generator, or any signal representing the available output power from the voltage source, drops or falls below the lower threshold value. The starting circuit continues to operate until the input voltage becomes too weak to sustain the system output voltage. The starting circuit is particularly configured to operate at an ultra-low input voltage that may be as low as 1.0 mV. The lower threshold voltage ranges from 5 mV to about 250 mV, depending on the application and configuration.

Such low operating input voltage levels allow the use of a simple thermoelectric element, with a limited number of PN type elements, presenting a significant manufacturing cost reduction. Such step-up DC to DC converters with ultra-low starting voltage levels allow thus to build self-powered applications with temperature differences as small as 1° C. to 5° C. and thermoelectric elements with no more than 5 pairs of PN elements.

The upper threshold voltage may be slightly or considerably larger than the lower threshold voltage, depending on the application and configuration depending on the application and configuration. It may range from 5 mV to 500 mV, and it may be 2 to 100 times larger than the lower threshold voltage. The switching between an ultra-low input voltage operation mode and a low input voltage operation mode may be triggered by the magnitude and hence the level of the output voltage, and/or the level of the output current, and/or a voltage provided by the voltage source, hence the input voltage, and/or any signal representing the available output power from the voltage source.

Whenever a sufficient input voltage is generated, the starting circuit starts to operate. When the input voltage increases above the upper threshold voltage level, the DC to DC converter circuit starts to operate while the starting circuit is deactivated. When the input voltage falls below the lower threshold voltage level, the starting circuit is re-activated while the DC to DC converter circuit is deactivated.

The lower and upper threshold voltage levels, or any lower and upper level of a signal representing the available output power from the voltage source, result in a hysteresis behavior of the circuit, preventing system oscillation at a critical power input level.

By means of the controller and by means of dynamically switching the thermoelectric generator and hence the voltage converter from the ultra-low voltage operation mode into the low voltage operation mode and vice versa, a more efficient and favorable voltage conversion can be provided for each available input voltage range.

For instance, in an ultra-low input voltage regime the starting circuit provides an improved conversion efficiency, or at least a useful output voltage that the DC to DC converter circuit could not generate at all. Since the voltage of the voltage source is subject to dynamic changes and depends on a temperature difference applied to a thermoelectric element, the efficiency of the voltage conversion conducted by the starting circuit may drop as the magnitude of the voltage provided by the voltage source increases. Then and as the voltage of the voltage source or as the voltage at the output rises above the predefined upper threshold level, the DC to DC converter circuit may be more efficient for converting the input voltage. Then and by means of the controller, the starting circuit is deactivated at the benefit of activating the DC to DC converter circuit.

Typically, the starting circuit naturally starts at very low input voltage levels and charges an output capacitor acting as a temporary energy storage device. Moreover, the DC to DC converter circuit that is connected to the voltage source exhibits an increasing conversion efficiency with increasing input voltage levels.

According to another embodiment the DC to DC converter circuit comprises a boost converter having at least one inductor and at least a first switch that is controlled by the controller. By means of a boost converter an input voltage or a voltage provided by the voltage source can be stepped up. Alternative to the at least one inductor, the boost converter may also comprise a capacitor or a combination of a capacitor and an inductor.

By means of the first switch the DC to DC converter circuit and in particular its boost converter can be selectively activated or deactivated by the controller.

In another embodiment the DC to DC converter circuit comprises a second switch controlled by the controller. One end of the second switch is connected to the output of the thermoelectric generator and another end of the second switch is connected to the inductor. In this way and when the second switch of the DC to DC converter is switched on the diode of the DC to DC converter or of the boost converter is effectively shortcut in order to avoid a voltage drop across the diode.

According to a further embodiment the first switch and the second switch of the DC to DC converter circuit are metal oxide semiconductor transistors. One of the first switch and the second switch is an N-type MOS transistor wherein the other one of the first switch and the second switch is a P-type MOS transistor.

The first switch of the boost converter provides and allows a controlled inductor current sawtooth-like waveform from the input voltage, with duty cycle modulation to optimize the DC to DC voltage conversion. The second switch allows to minimize a voltage drop across a diode of the boost converter or of the DC to DC converter. The inductor current is built up from the input voltage when the first switch is conducting, and flows toward the output through an isolation diode when the first switch goes to off-state.

According to a further embodiment, the controller comprises a pulse width modulation (PWM) regulator. A PWM regulator enables a concurrent activation and deactivation or a concurrent switching of the first switch and the second switch of the DC to DC converter circuit.

In another embodiment the control further comprises a capacitor arrangement comprising at least two capacitors to store a negative voltage configured to operate the second switch. The capacitor arrangement is configured to accumulate electrical charges provided by the starting circuit. When the thermoelectric generator is operating in the low voltage operation mode and when only the starting circuit is activated while the DC to DC converter circuit is deactivated, the capacitor inside the controller charges periodically while the starting circuit oscillates. With each oscillation of the starting circuit the voltage and the charge supplied to the capacitor or to the controller increases step-by-step. As soon as the voltage provided by the voltage source or as soon as a voltage provided at the output of the thermoelectric generator, or any signal representing the available output power from the voltage source rises above a predefined upper threshold voltage, the PWM regulator activates the first switch of the converter circuit and concurrently shuts down the starting circuit via the second switch that is in series to the first switch of the starting circuit.

By means of the capacitor placed at the common output of the circuit, the controller and hence the PWM regulator can be exclusively driven from electrical energy that is provided by the starting circuit during its start-up phase.

According to another example the starting circuit comprises a transformer, at least a third switch and a rectifier. By means of the transformer, the at least third switch and the rectifier, a self-oscillating starting circuit can be provided that is operable to start-up and to start oscillating as soon a rather low voltage, even below 1 mV, is present at an input of the starting circuit or at an output of the voltage source.

In a further example the third switch is a metal oxide semiconductor (MOS) depletion transistor. Such a depletion transistor has a negative threshold voltage, so that it is substantially conducting across its drain and source terminals at a zero control voltage across the gate-to-source terminals. In effect, the conductivity of the depletion transistor can be effectively modulated around a zero control voltage. Moreover, by means of a depletion transistor implemented with a MOS technology, the use of PN junctions or high electron mobility field effect transistors can be avoided.

The PN junction field effect transistors have already been used to build self-oscillating converters operating at input voltages as low as 10 mV, but their poor operation usually limits the circuit efficiency to 10% or less. The high electron mobility field effect transistors perform better than the PN junction field effect transistors, but their fabrication complexity and cost exceeds those of MOS transistors, with poorer electrical performance. Typically, the MOS depletion transistor features a non-zero channel conductivity across the drain and source terminals at zero voltage across the gate and source terminals. Such a depletion transistor can be implemented and provided by a proper ion implantation step added the standard MOS fabrication process. Such transistors have been shown to be more efficient than high electron mobility transistors that are commercially available.

According to a further embodiment, a secondary side of the transformer is connected to a full wave rectifier, and is connected to the gate terminal of the depletion transistor used as a third switch. Typically, the depletion transistor and the rectifier are connected in parallel. They are both connected to one and the same node of the secondary side of the transformer. In some cases, the gate terminal of the depletion transistor is connected to the transformer's secondary side through a small value coupling capacitor, typically 10 to 1,000 pF, in order to reduce the amount of feedback or limit the voltage excursion across the gate to source terminals. In such cases, an additional high value resistor, typically 1 to 100 MOhms, has to be placed across the gate to source terminals to define the average DC potential.

Typically, the rectifier is connected to an output storage capacitor and an output terminal, and provides a converted DC voltage of typically 1 to 5 Volts even at rather low input voltages in the range of a few millivolts only.

According to a further embodiment, a primary side of the transformer is connected to the drain of the MOS depletion transistor. The primary side is further connected to an input storage capacitor, allowing current peaks to be delivered during the switching phase, and to the input voltage source. Here, the drain of the depletion transistor is connected to the voltage source via the primary side of the transformer. In other words, the primary side of the transformer is connected in series with the drain of the depletion transistor and the voltage source.

According to a further embodiment the depletion transistor combined with the other circuit elements exhibits a voltage gain largely below unity, mainly because it operates in the so-called linear range of its electrical transfer characteristics. The transformer is designed to provide a large voltage gain through a large secondary to primary turn ratio. Furthermore, the product of the transformer gain by the gain of the depletion transistor is proportional to the voltage provided at the input of the circuit input. According to the transformer design, it may become larger than unity at relatively small input voltage levels of 1 mV or less. In other words, and since the gain of the depletion transistor is largely lower than unity the depletion transistor is used in a linear regime, similar to a voltage-controlled resistor.

In order to make it possible for the starting circuit to oscillate, the transformer with a gain largely higher than unity is added, and a positive feedback loop is formed by connecting the transistor gate terminal to the transformer output with zero phase shift. In other words, the rather low gain of the depletion transistor is offset by the transformer gain. When the product of the transformer gain and the gain of the depletion transistor is larger than unity a self-oscillation condition is met. As long as the input voltage or a voltage provided by the voltage source does not exceed the starting voltage level, and as long as the oscillation condition has not been met, there are no oscillations and no signal is generated at the secondary side of the transformer.

In another embodiment, the thermoelectric generator comprises a fourth switch that is arranged in series to the third switch. The fourth switch is driven by the controller. By means of the fourth switch in series with the third switch, the starting circuit can be selectively activated or deactivated, simply by switching the fourth switch between a conducting and a non-conducting state.

According to another embodiment the fourth switch is a highly conductive depletion type MOS transistor having a channel resistance value below 100 milliOhm at a gate to source voltage of 0 V. Typically, the fourth switch and hence the second metal oxide semiconductor transistor is placed between the source of the first transistor, hence the source of the depletion transistor and ground. In this way operation of the starting circuit can be stopped once its function is performed. The rather low channel resistance of the second metal oxide semiconductor transistor is beneficial in order to only introduce a minimal voltage drop at the start of an oscillation of the self-oscillating starting circuit in order to maintain the conversion efficiency of the starting circuit.

In another embodiment, the thermoelectric generator further comprises an output capacitor connected to the output. The output capacitor provides an electric energy supply buffer for the controller. Moreover, the output capacitor connected in parallel to a load connectable to the output of the thermoelectric generator is capable of delivering short currents peaks drained by the load while maintaining the output voltage.

In another aspect a mobile electronic device is provided comprising at least one thermoelectric generator as described above. The mobile electronic device may comprise a medical or data-logging device to be carried along by a person or attached to a static or mobile object generating heat. Alternatively, the mobile electronic device may comprise a wrist watch or a smartphone also carried along by a person. The mobile electronic device is configured to be in direct contact with the skin of a user or of a person, or any surface of an object generating heat. In this way the thermoelectric generator of the mobile electronic device can be in permanent thermal contact with a thermal reservoir or with a source of thermal energy.

In another aspect a sensor and/or a data-logging device is provided. The sensor and/or the data-logging device is embedded in a distributed sensing devices network. Here, the sensor and/or the data-logging device comprise a thermoelectric generator as described above. In this way, electrical energy can be supplied to a sensor or to other devices being part of a distributed pending devices network within an environment, where some heat flow can be harvested.

BRIEF DESCRIPTION OF THE DRAWINGS

In the following an embodiment of the present invention will be described in more detail by making reference to the drawings, in which.

DETAILED DESCRIPTION

Figure 1:
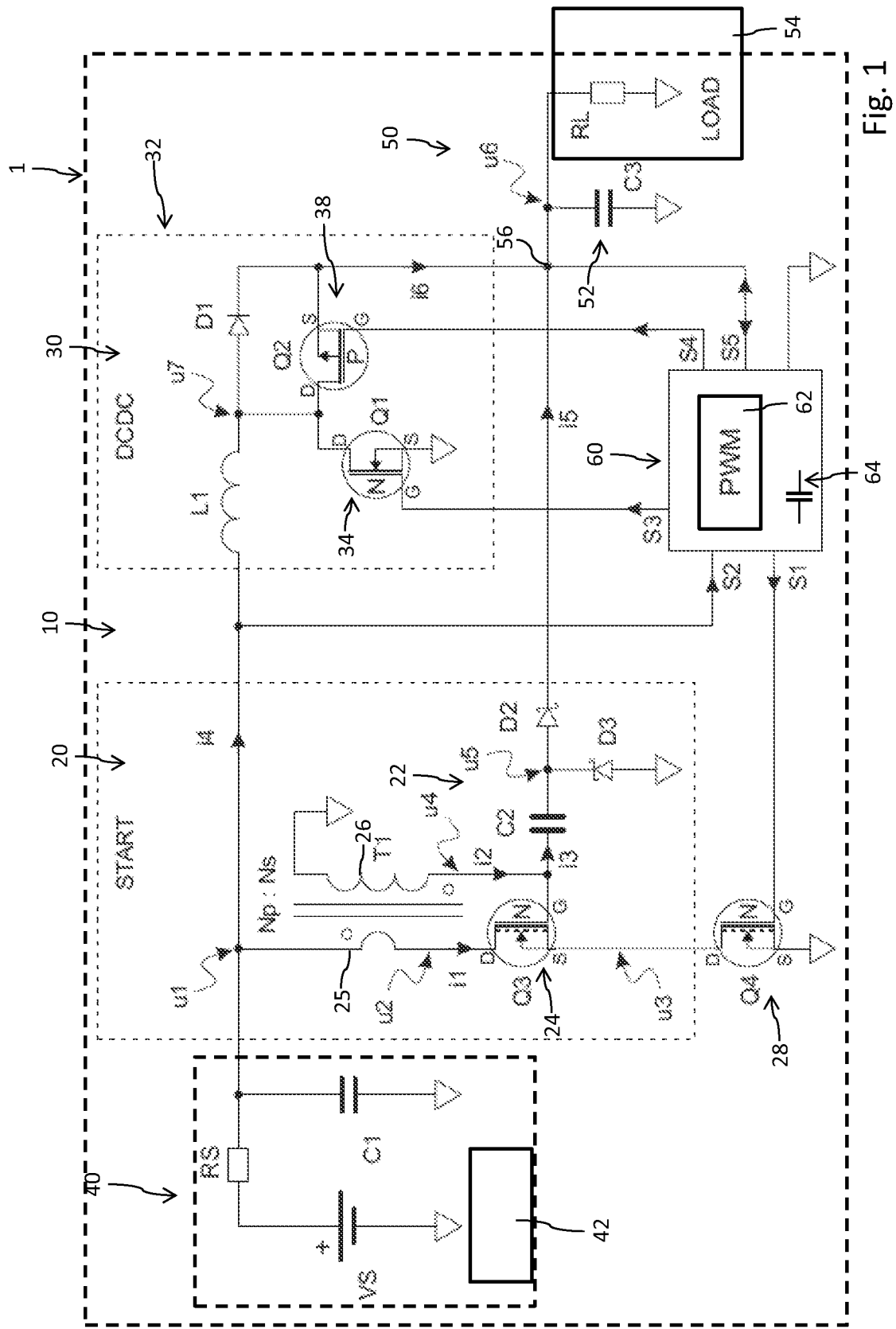
FIG. 1 schematically shows an embodiment of a thermoelectric generator.

In FIG. 1 a schematic illustration of an embodiment of the thermoelectric generator 10 is provided. The thermoelectric generator 10 comprises a voltage source 40 and a starting circuit 20 that is connected to the voltage source 40. The thermoelectric generator 10 further comprises a DC to DC converter circuit 30 that is also connected to the voltage source 40. There is further provided an output 50 connected to a load 54 or connectable to a load 54. The output 50 is connected to the DC to DC converter 30 as well as to the starting circuit 20. In other words, there is provided an output node 56 that is connected to both, the starting circuit 20 as well as to the DC to DC converter circuit 30.

The thermoelectric generator 10 further comprises a controller 60 connected to the starting circuit 20 and connected to the DC to DC converter circuit 30. The controller 60 is connected to the starting circuit 20 via the connection S1. The controller 60 is further connected to the voltage source 40 through the connection S2. The controller 60 is connected to the output node 56 via a connection S5.

The controller 60 is configured to deactivate the starting circuit 20 and to activate the DC to DC converter circuit 30 when a voltage u6 at the output 50 is above a predefined threshold voltage or when a voltage u1 provided by the voltage source 40 is above a predefined threshold voltage. The controller 60 is configured to concurrently activate and to deactivate the starting circuit 20 and the DC to DC converter circuit 30. The controller 60 is configured to activate one of the starting circuit 20 and the DC to DC converter circuit 30 and to deactivate the other one of the starting circuit 20 and the DC to DC converter circuit 30 at a time.

Assuming that the voltage at the output 50 or the voltage provided by the voltage source 40 is above the predefined upper threshold voltage the DC to DC converter circuit 30 is activated while the starting circuit 20 is deactivated. If the voltage at the output 50 or if the voltage provided by the voltage source 40 drops below the predefined threshold the controller is further configured to deactivate the DC to DC converter circuit 30 and to activate the starting circuit 20 again.

The controller 60 is particularly configured to activate one of the starting circuit 20 and the DC to DC converter circuit 30 dependent on the magnitude of at least one of the output voltage u6 and the input voltage u1.

The starting circuit 20 comprises a self-oscillating voltage converter that is particularly configured for voltage conversion for input voltages u1 in the range of a few millivolts. The starting circuit 20 may be configured to operate at a lower threshold voltage, i.e. a starting voltage below 1 mV. The starting circuit 20 may start oscillating at such low input voltages and may be configured to generate, in a very short time, useful voltages of more than 1 V to power the DC to DC converter circuit 30 acting and behaving as a main converter. The starting circuit 20 may therefore act and behave as an auxiliary voltage converter dedicated for very low power and very low voltage input.

The starting circuit 20 comprises a transformer T1 and at least a third switch 24 as well as a rectifier 22. The transformer T1 is connected to the voltage source 40 with a primary side 25. One end of the primary side 25 is connected to the voltage source 40 while the other end of the primary side 25 is connected to the third switch 24. A current i1 flows through the primary side 25 as an input voltage u1 is present, even below the onset of oscillations, since the third switch 24 is somewhat conducting at zero control voltage. The rectifier 22 and the secondary side 26 of the transformer T1 are connected in parallel. They are both connected to the third switch 24. The third switch 24 comprises a metal oxide semiconductor depletion transistor Q3. The depletion transistor Q3 has a negative threshold. It is effectively conducting with a zero control voltage as illustrated in the diagram according to FIG. 2.

The depletion transistor Q3 can be effectively modulated around a voltage of about 0 V. In the illustrated embodiment a drain of the depletion transistor Q3 is connected to the primary side 25 of the transformer T1. A source of the depletion transistor Q3 is connected to a drain of a further NMOS transistor Q4 implemented as a fourth switch 28. The fourth switch 28 and hence the NMOS transistor Q4 is controlled by the controller 60. Its drain is connected to the source of the depletion transistor Q3. The source of the transistor Q4 is connected to ground. A gate of the transistor Q4 is connected to the controller 60 via a connection S1.

The voltage source 40 may comprise a thermoelectric element 42. The resistor RS and the capacitor C1 represent the internal resistance and internal capacitance of the voltage source 40. For instance, the thermoelectric element 42 may comprise a rather limited size of 6×6×1.6 mm³. It may comprise an internal resistance of about 2 Ohms. It may exhibit a Seebeck coefficient of about 6 mV/° C.

In the presently illustrated embodiment an input voltage of 6 mV is enough to produce an output voltage of 1.5 for less than 1 second with an output current of 1 µA. In this way, a power of 1.5 µW may be obtained with a conversion efficiency exceeding 40%. The 6 mV of input voltage u1 can be provided by a temperature difference of only 1° C. between the faces of the thermoelectric element 42.

When the temperature difference applied to the thermoelectric element increases the input voltage u1 increases as well and the performance of the starting circuit 20 may substantially decrease, mainly due to impedance mismatch. In such a regime and when the input voltage u1 exceeds a threshold of about 50 mV, 100 mV or even more, depending on the transformer ratio and system output voltage, the DC to DC converter circuit 30 behaving as a main converter becomes more efficient. This is because it optimizes the energy transfer according to a pulse width modulation principle for charging an inductor L1, functioning as an active impedance matching between source and load.

Figure 2:
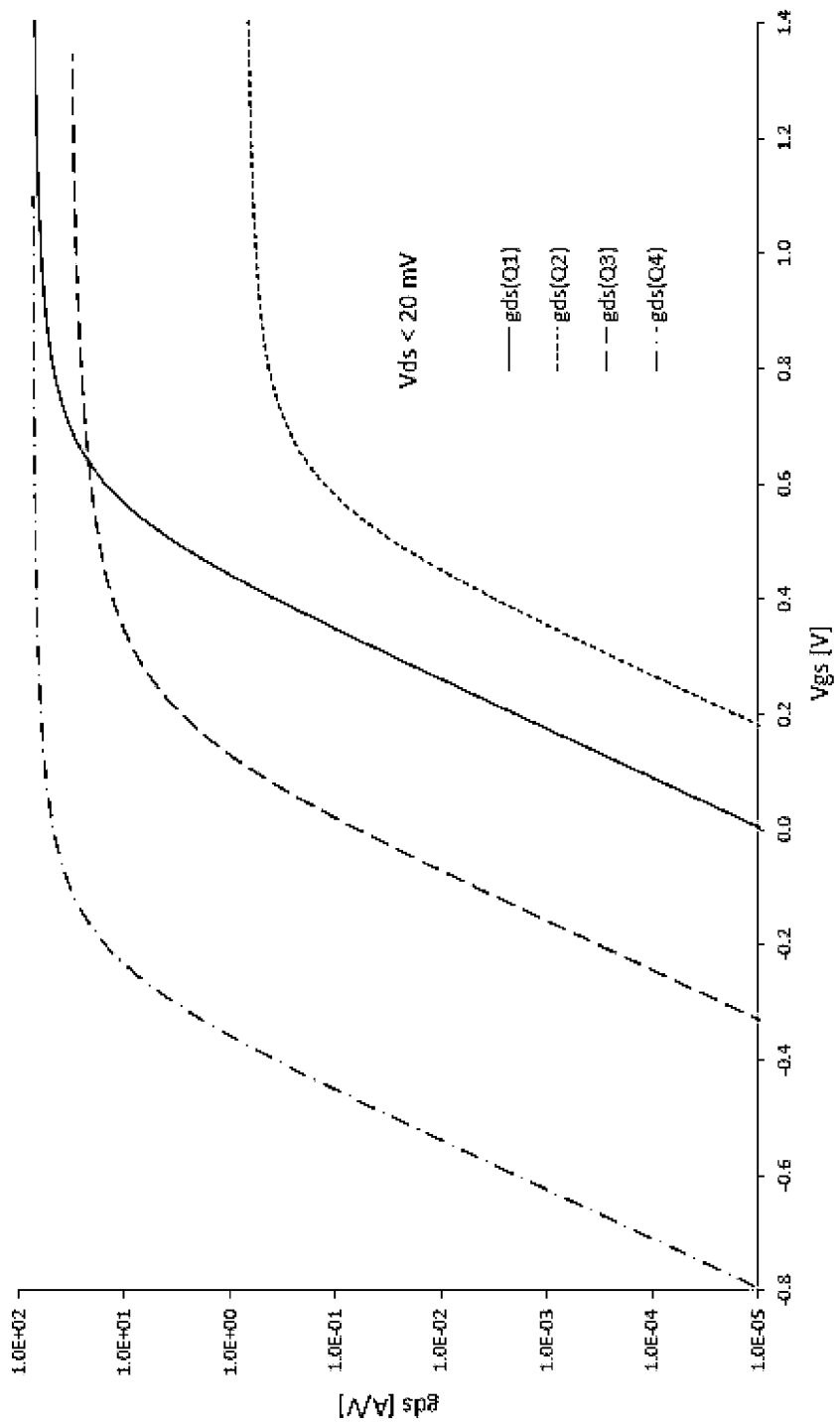
FIG. 2 shows characteristic curves of various switches of the thermoelectric generator.

The switches or the NMOS transistors Q3, Q4 of the starting circuit 20 are used as variable resistors with a high conductivity (gds) in the on-state. Their conductance, which is the current to voltage ratio is illustrated in FIG. 2 as a function of the gate-source voltage (Vgs). Since the depletion transistor Q3 is used in the linear regime its voltage gain is lower than unity and depends almost linearly on u2, itself almost equal to u1 before the onset of oscillations. To make it possible for the starting circuit 20 to oscillate, a transformer T1 comprises a gain r=Ns/Np, wherein r is larger than unity, so that the product of both gains may be equal to or exceed unity. In other words the low gain of Q3 is compensated by the transformer gain. The oscillator condition is met if the gain r of the transformer multiplied by the gain of Q3 is larger than unity at a certain value of u2 or u1 called the starting voltage. Here, Ns represents the number of windings of the secondary side and Np represents the number of windings of the primary side of the transformer T1.

As long as the input voltage u1 as provided by the voltage source 40 is weak there are no oscillations of the starting circuit 20. If the input voltage u1 exceeds a certain level, which may be as low as 0.5 mV, the starting circuit 20 starts to oscillate. During operation of the starting circuit 20 the depletion transistor Q3 periodically opens and closes at a frequency and duty cycle depending on the input voltage u1. The depletion transistor Q3 behaves and acts like a switch. When the transformer output voltage u4, used as a feedback signal on the gate of the depletion transistor Q3, is larger than zero, Q3 conducts and the primary current i1 of the transformer T1 is increasing. Since this current i1 cannot increase indefinitely, at some point depending on the DC resistance of the primary winding of T1 added to the resistance of Q3, this current stops increasing.

As a consequence, the voltage u4 drops. When the voltage Q4 becomes negative, the transistor Q3 turns off quite sharply. The capacitor C2 is charged by a current i3 during the negative phase of u4, discharging thus the transformer stored energy accumulated when Q3 was switched on. The voltage u4 returns therefore back to zero and eventually positive values, leading to a sharp turn-on of Q3. In this way, the entire transformer T1 and the starting circuit 20 oscillate at a given frequency depending on the circuit and input/output voltage parameters. The oscillation frequency is only predefined at the onset of oscillation, before any electrical power is transferred to the output.

The gate terminal of Q3 may be indirectly coupled through a small value capacitor, typically in the range of 0.2 to 2 times the values of the gate-to-source capacitance of Q3, to optimize the control of Q3 according to the circuit and output voltage parameters. This capacitor and the gate-to-source capacitance of Q3 form a capacitive voltage divider acting as a voltage level matching improving the efficiency depending on the circuit and output voltage parameters. The capacitive coupling is typically useful for output voltage values above 1.5 V. It may become mandatory to protect Q3 when a high system output voltage is required, for example 5 V. When using such a capacitive coupling, an additional resistor has to be placed between the gate and source terminal to fix the DC potential of the gate terminal.

The capacitor C2 and the diodes D2 and D3 form a full wave rectifier 22 by way of which a rectified output voltage u6 and an output current i5 are provided to the output 50. An oscillating current i3 of the secondary side 26 of the transformer T1 alternatively used to charge C2 through D3 during the negative phase of u4, and charge C3 through D2 during the positive phase of u4, resulting in a full wave rectification process. Since the controller 60 is connected to the output 50 via the connection S5 the controller 60 is enabled to determine and to measure the instantaneous output voltage in order to decide whether the thermoelectric generator should be switched from the ultra-low voltage operation mode, in which the starting circuit 20 is active, into the low voltage operation mode, in which the DC to DC converter circuit 30 is active, and control actively its duty cycle to optimize its efficiency.

The frequency f0 at which the starting circuit 20 starts to oscillate is governed by the transformer impedance. It calculates as $$f0 = \frac{1}{2\pi\sqrt{L_s C_s}},$$

with Ls and Cs representing the total inductance and capacitance at the secondary side 26 of the transformer T1. This frequency can only decrease as u1 increases, because a related increase of amplitude of i1 means a longer charging time and discharging time of the transformer T1.

In the starting circuit 20 the NMOS depletion transistor Q3 is looped back with the transformer T1 with the gain r so as to obtain and gain higher than unity, thus enabling the starting circuit 20 to oscillate and to generate the necessary voltage for starting the DC to DC converter circuit 30 through a sufficiently high transformer ratio.

The fourth switch 28 and hence the NMOS depletion transistor Q4 is placed between the source of the depletion transistor Q3 and ground. In this way the operation of the starting circuit 20 can be stopped once the input power and output voltage are sufficient to operate the DC to DC converter 30. The transistor Q4 has a channel resistance typically lower than 100 mOhm at a gate-source voltage of 0 V. So at the start of operation of the starting circuit 20 the transistor Q4 only introduces a minimal voltage drop u3 that does not disturb the functioning of the starting circuit 20. When the voltage generated by the voltage source 40 increases and enables amplitudes of about 50 mV or 100 mV or even hundreds of millivolts at the secondary side 26 of the transformer T1, measured as u4, the Schottky diodes D2 and D3 start conducting and charging C2 and C3 of the output 50 and thus produce a useful output voltage u6.

As the useful power is transferred to the output 50, the voltage at the output of the transformer T1 starts to saturate and presents almost rectangular waveforms. The total magnetization current of the transformer T1, i.e. −Np×i1+Ns×i2, is typically a sawtooth-like waveform. The gate terminal of the NMOS transistor Q4 is linked to the output 50 via the controller 60 so that its channel resistance may decrease to quite low values even below 20 mOhms after starting of the starting circuit 20.

The DC to DC converter circuit 30 comprises a boost converter 32. It is configured to step up an input voltage u1 into an output voltage u6 being much larger than the input voltage u1. The DC to DC converter circuit 30 comprises an inductor L1, a diode D1 as well as at least a first switch 34. In the present embodiment the DC to DC converter circuit 30 comprises a first switch 34 and a second switch 38. Here, the second switch 38 is only optional. It improves operation and performance of the DC to DC converter circuit 30. The DC to DC converter circuit could also operate without the second switch 38.

The controller 60 is separately connected to each one of the first switch 34 and the second switch 38. In the present embodiment the first switch 34 is implemented as an NMOS transistor Q1 while the second switch 38 is implemented as a PMOS transistor Q2. The drain of the NMOS transistor Q1 is connected to a drain of the PMOS transistor Q2. The source of the NMOS transistor Q1 is connected to ground whereas the source of the PMOS transistor Q2 is connected to the output node 56. The gate of the transistor Q1 is connected to the controller 60 via the connection S3. The gate of the transistor Q2 is connected to the controller 60 via the connection S4.

Since the controller 60 is separately connected to the gates of the transistors Q1 and Q2 the controller 60 is enabled to separately and independently switch the transistors Q1 and Q2. The controller 60 comprises a PWM modulator 62. The controller 60 or the PWM modulator 62 comprises at least one capacitor arrangement 64 comprising at least two capacitors. As long as the thermoelectric generator 10 is in the low voltage operation mode and as long as the starting circuit 20 is operating the capacitor arrangement 64 inside the controller 60 successively charges. With each oscillation of the voltage u4 the capacitor arrangement 64 is charged step by step, i.e. the voltage u6 increases step-by-step.

When a sufficient and useful voltage u6, above a predefined upper threshold voltage, e.g. in the range of at least 50 mV or at least 100 mV, is provided the PWM modulator 62 activates the NMOS transistor Q1. The regulator 62 and hence the controller 60 then also shut down the starting circuit 20 via the NMOS transistor Q4 by applying a negative gate voltage below 0.7 V to the gate of the transistor Q4. As a consequence the starting circuit 20 is deactivated.

The controller 60 or the PWM modulator 62 comprises a capacitor arrangement 64 comprising at least two capacitors to generate and to store a negative voltage used to de-activate the fourth switch 28 or Q4. This negative voltage may be generated by an ultra-low power charge pump comprised in the controller 60 or the PWM modulator 62.

It should be noted that the PWM regulator 62 as well as the controller 60 does not comprise an internal power source. It receives accumulated energy through the starting circuit 20 to generate a first impulsion for switching the switches 34, 38 and hence the transistors Q1 and Q2, respectively. Then, the output capacitor 52, i.e. C3 is charged and the PWM regulator 62 is configured to use the electrical energy of C3 for switching Q1 and Q2.

In a first phase of the DC to DC converter 30 the first switch 34 is closed. Consequently, the voltage u7 is close to 0 V. During this first time phase the inductor L1 is charged and the current in the inductor L1, almost equal to i4, increases. When the inductor L1 is saturated or when it is charged enough during this first time phase the first switch 34 and hence the NMOS transistor Q1 is opened. This leads to an abrupt voltage increase at the u7 node, and the inductor current starts to discharge through the diode D1, to charge C3. In the present example, the ratio of the time intervals ton/toff is typically ranging from 50 to 500 in order to maintain system output voltage u6 e.g. at about 2.5 V.

Optionally, during a third time phase the second switch 38 is used. As the second switch 38 and hence the PMOS transistor Q2 is closed, the current i4 flows through the second switch 38 as current i6. In this way the diode D1 is a shortcut to avoid a voltage drop across the diode D1 and unnecessary power loss. The on-state resistance of the second switch Q2 does not need to be very small, because the output current i6 is quite small and will generate quite a small voltage drop across Q2. In this manner the current flows through Q2 instead of D1.

As an example and when the input voltage u1 provided by the voltage source 40 increases to 120 mV that may result from a temperature difference of 20° C. the source resistance RS may remain about 2 Ohms. The output voltage u6 can be regulated at around 2.5 V with a maximal output power of up to 1.4 mW. With the starting circuit 20 alone such output power could not be generated efficiently.

In the DC to DC converter circuit 30, we observe an on-state duty cycle of Q1 close to 100%. This means that the NMOS transistor Q1 charges most of the time the inductor L1 with the input voltage u1, up to currents values of several 10 mA, at frequencies of 5 to 50 kHz, depending on the input voltage u1 and inductance value of L1. The NMOS transistor Q1 is periodically turned off during a small fraction of the cycle, e.g. around 2.5% of the cycle, so as to charge the output capacitance C3 via the diode D1, which may be implemented as a Schottky diode. The PMOS transistor Q2 is periodically switched during this cycle fraction with a predefined dead time of e.g. 20 ns. The PMOS transistor Q2 enables increasing the conversion efficiency by efficiently decreasing the voltage drop of 300 mV to 400 mV across the Schottky diode D1 to less than 100 mV. The ripple of the output voltage u6 can be reduced to about 30 mV or even less by using the proper capacitance value for C3.

In practical applications, the voltage converter and hence the thermoelectric generator 10 will be able to produce more power than the final user at most of the time will be able to use. Moreover, the final user may periodically draw relatively high power peaks during a short time than what the thermoelectric generator may provide, supplied by the energy stored in C3.

For both cases, the thermoelectric generator 10 is provided with means for temporary accumulating electric energy. The thermoelectric generator 10 may comprise an output capacitor or a super-capacitor or an accumulator. In this case the controller 60 and the PWM regulator 62 will be configured to optimize the energy transfer according to the voltage on such accumulation means.

The thermoelectric generator 10 may be implemented in a portable electronic device 1. The portable electronic device 1 may comprise a medical device, e.g. an injection device, a wristwatch or it may comprise a smartphone. Typically, the thermoelectric element 42 is in direct contact with the skin of a person, or with any object generating heat. So, the person or the object can be used as a thermal reservoir from which the electric energy to drive the thermoelectric generator 10 and hence the portable electronic device 1 can be withdrawn.

REFERENCE NUMBERS 1 portable electronic device
10 thermoelectric generator
20 starting circuit
22 rectifier
24 third switch
25 primary side
26 secondary side
28 fourth switch
30 DC to DC converter circuit
32 boost converter
34 first switch
38 second switch
40 voltage source
42 thermoelectric element
50 output
52 output capacitor
54 load
56 output node
60 controller
62 regulator
64 capacitor arrangement

What is claimed is:

1. A thermoelectric generator comprising:
a voltage source comprising a thermoelectric element,
a starting circuit connected to the voltage source,
a DC to DC converter circuit connected to the voltage source,
an output connected to the starting circuit and connected to the DC to DC converter circuit, and
a controller having an input connected to the voltage source, and outputs connected to the starting circuit and to the DC to DC converter circuit,
wherein the controller is configured:
to deactivate the starting circuit and to activate the DC to DC converter circuit when a voltage at the output or when a voltage provided by the voltage source rises above a predefined upper voltage threshold, and
to reactivate the starting circuit and to deactivate the DC to DC converter circuit when a voltage at the output or when a voltage provided by the voltage source drops below a predefined lower voltage threshold.

2. The thermoelectric generator according to claim 1, wherein the DC to DC converter circuit comprises a boost converter having at least one inductor and at least a first switch controlled by the controller.

3. The thermoelectric generator according to claim 2, wherein the DC to DC converter circuit comprises a second switch controlled by the controller, and wherein one end of the second switch is connected to the output and another end of the second switch is connected to the inductor.

4. The thermoelectric generator according to claim 3, wherein the first switch and the second switch of the DC to DC converter circuit are metal oxide semiconductor transistors and wherein one of the first switch and the second switch is an NMOS transistor, the other one of the first switch and the second switch being a PMOS transistor.

5. The thermoelectric generator according to claim 1, wherein the starting circuit comprises a transformer, a third switch and a rectifier, the third switch being a metal oxide semiconductor depletion transistor, and a secondary side of the transformer being connected to the rectifier and to a gate of the depletion transistor.

6. The thermoelectric generator according to claim 5, wherein a primary side of the transformer is connected to a drain of the third switch and to the voltage source.

7. The thermoelectric generator according to claim 5, wherein the third switch comprises a gain lower than 1 and wherein the transformer has a gain larger than 1, the product of the transformer gain and the gain of the depletion transistor being larger than 1.

8. The thermoelectric generator according to claim 5, further comprising a fourth switch in series with the third switch and wherein the fourth switch is controlled by the controller.

9. The thermoelectric generator according to claim 8, wherein the fourth switch is a metal oxide semiconductor transistor having a channel resistance value below 100 mOhm at a gate-source voltage of 0 V.

10. The thermoelectric generator according to claim 8, wherein the controller comprises a capacitor arrangement comprising at least two capacitors to store a negative voltage configured to operate the fourth switch.

11. The thermoelectric generator according to claim 1, wherein the controller comprises a pulse width regulation regulator.

12. The thermoelectric generator according to claim 1, further comprising an output capacitor connected to the output and providing an electric energy supply for the controller.

13. A mobile or portable electronic device comprising: the thermoelectric generator according to claim 1.

* * * * *